United States Patent
Fritzemeier et al.

(10) Patent No.: US 6,428,635 B1
(45) Date of Patent: *Aug. 6, 2002

(54) SUBSTRATES FOR SUPERCONDUCTORS

(75) Inventors: Leslie G. Fritzemeier, Acton, MA (US); Elliott D. Thompson, Coventry, RI (US); Edward J. Siegal, Malden, MA (US); Cornelis Leo Hans Thieme, Westborough, MA (US); Robert D. Cameron, Franklin, MA (US); James L. Smith; W. Larry Hults, both of Los Alamos, NM (US)

(73) Assignees: American Superconductor Corporation, Westborough, MA (US); The Regents of the University of California, Oakland, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/942,038

(22) Filed: Oct. 1, 1997

(51) Int. Cl.[7] .......................... C30B 29/10; C30B 25/18
(52) U.S. Cl. ...................... 148/435; 420/485; 505/473; 505/500; 505/236; 505/474; 505/470; 117/95; 117/96; 117/101; 117/106
(58) Field of Search .................. 148/435; 420/485; 505/473, 500, 236, 474, 470; 117/95, 96, 101, 106

(56) References Cited

U.S. PATENT DOCUMENTS

| 1,823,938 A | 9/1931 | Henke |
| 2,583,613 A | 2/1952 | Allen |
| 2,739,907 A | 3/1956 | Nowak et al. ............... 117/106 |
| 3,109,331 A | 11/1963 | Cordray et al. ............... 80/60 |

(List continued on next page.)

FOREIGN PATENT DOCUMENTS

| CA | 697916 | 11/1964 | |
| DE | 19501223 A1 | 7/1996 | |
| EP | 0392659 A3 | 8/1990 | |
| EP | 0 410 373 A2 | 1/1991 | |
| EP | 0 312 015 B1 | 12/1992 | |
| EP | 0 341 788 B1 | 8/1993 | |
| JP | 1-100820 | 4/1954 | |
| JP | 1-100818 | 10/1987 | |
| JP | 63/314712 | * 12/1988 | ................... 505/1 |
| JP | 64-57513 | * 3/1989 | ................... 505/1 |
| JP | 05025565 | 2/1993 | |
| JP | 06279944 | 4/1994 | |
| JP | 6-139848 | 5/1994 | |
| WO | WO 96/32201 | 10/1996 | |

OTHER PUBLICATIONS

*ASM Handbook vol. 2: Properties and Selection:* Nonferrous Alloys and Special–Purpose Materials, ed. by Davis et al, Pub. by ASM International, 1992, p. 436.

Goler and Sachs, Zeitschrift fur Physik, vol. 59, pp. 485–494 (1929) (German Version).

(List continued on next page.)

*Primary Examiner*—Robert Kunemund
(74) *Attorney, Agent, or Firm*—Fish & Richardson, PC (57) ABSTRACT

An alloy capable of forming a (100) [001] cube-texture by thermo-mechanical techniques has 5 to 45 atomic percent nickel with the balance being copper. The alloy is useful as a conductive substrate for superconducting composites where the substrate is coated with a superconducting oxide. A buffer layer can optionally be coated on the substrate to enhance deposition of the superconducting oxide. Methods for producing the alloys, substrates, and superconductors are included.

81 Claims, 5 Drawing Sheets

| 100 | |
|---|---|
| 101 | SELECT AND WEIGH THE CONSTITUENT METALS |
| 102 | MELT THE CONSTITUENTS AND COOL |
| 103 | REMELT TO ENHANCE HOMOGENEITY |
| 104 | SHAPE THE SOLIDIFIED MELT AND REDUCE IN SIZE TO FURTHER HOMOGENIZE |
| 105 | MECHANICALLY DEFORM THE SHAPE TO A SMALLER SIZE AND RECRYSTALLIZE TO FORM A SMALL GRAIN SIZE |
| 106 | DEFORMING THE SHAPE IN AN AXIALLY SYMMETRIC MANNER TO A SMALLER SIZE. |
| 107 | PLANAR DEFORM THE ALLOY TO A REDUCTION IN THICKNESS OF BETWEEN 85% TO 99.9% |
| 108 | HEAT TREAT AT A TEMPERATURE EXCEEDING 250°C BUT NOT MORE THAN 95% OF THE MELTING TEMPERATURE |

U.S. PATENT DOCUMENTS

| | | | |
|---|---|---|---|
| 3,615,917 A | 10/1971 | Shin et al. | 148/111 |
| 3,648,355 A | 3/1972 | Shida et al. | 29/471.7 |
| 3,692,596 A | 9/1972 | Fraser et al. | |
| 3,700,427 A | 10/1972 | Hoppin, III et al. | 75/0.5 R |
| 3,713,211 A | 1/1973 | Freeman, Jr. | 29/599 |
| 3,770,497 A | 11/1973 | Hässler et al. | 117/212 |
| 3,778,237 A | 12/1973 | Shapiro et al. | 29/199 |
| 3,845,543 A | 11/1974 | Roth et al. | 29/472.3 |
| 3,982,973 A | 9/1976 | Peters et al. | |
| 4,024,617 A | 5/1977 | McCormick | 29/156.63 |
| 4,105,828 A | 8/1978 | Borchert et al. | 428/665 |
| 4,145,481 A | 3/1979 | Gupta et al. | 428/678 |
| 4,148,973 A | 4/1979 | Sexton et al. | |
| 4,246,321 A | 1/1981 | Shibata | 428/614 |
| 4,283,225 A | 8/1981 | Sexton et al. | |
| 4,367,102 A | 1/1983 | Wilhelm | 148/133 |
| 4,416,916 A | 11/1983 | Aykan et al. | 427/160 |
| 4,431,462 A | 2/1984 | Gould et al. | 148/11.5 Q |
| 4,537,642 A | 8/1985 | Saito et al. | 148/11.5 Q |
| 4,578,320 A * | 3/1986 | Mahulikar et al. | 148/435 |
| 4,640,816 A | 2/1987 | Atzmon et al. | 419/24 |
| 4,749,628 A | 6/1988 | Ahlert et al. | 428/660 |
| 4,788,082 A | 11/1988 | Schmitt | 427/248.1 |
| 4,909,859 A | 3/1990 | Nazmy et al. | 148/11.5 N |
| 4,917,967 A | 4/1990 | Cupolo et al. | 428/669 |
| 4,927,788 A * | 5/1990 | Nakashima et al. | 148/435 |
| 4,939,308 A | 7/1990 | Maxfield et al. | 505/1 |
| 4,980,341 A | 12/1990 | Gehring | 505/1 |
| 4,990,492 A | 2/1991 | Creedon et al. | |
| 4,994,435 A | 2/1991 | Shiga et al. | 505/1 |
| 4,994,633 A | 2/1991 | Puhn | |
| 5,006,507 A * | 4/1991 | Woolf et al. | 505/1 |
| 5,019,552 A | 5/1991 | Balooch et al. | 505/1 |
| 5,019,555 A | 5/1991 | Chin et al. | |
| 5,047,389 A | 9/1991 | Woolf et al. | 505/1 |
| 5,057,489 A | 10/1991 | Ohkawa et al. | |
| 5,059,582 A | 10/1991 | Chung | 505/1 |
| 5,063,200 A | 11/1991 | Okada et al. | 505/1 |
| 5,073,240 A | 12/1991 | Raggio et al. | |
| 5,074,907 A | 12/1991 | Amato et al. | 75/235 |
| 5,080,296 A | 1/1992 | Raggio et al. | |
| 5,089,057 A | 2/1992 | Plewes | 148/12.7 |
| 5,102,865 A | 4/1992 | Woolf et al. | 505/1 |
| 5,108,982 A | 4/1992 | Woolf et al. | |
| 5,110,790 A | 5/1992 | Feenstra et al. | 505/1 |
| 5,114,087 A | 5/1992 | Fisher et al. | |
| 5,118,663 A | 6/1992 | Woolf et al. | |
| 5,123,586 A | 6/1992 | Woolf et al. | |
| 5,140,006 A | 8/1992 | Woolf | |
| 5,147,849 A | 9/1992 | Tanaka et al. | 505/1 |
| 5,149,681 A | 9/1992 | Ohkawa et al. | |
| 5,149,684 A | 9/1992 | Woolf et al. | |
| 5,164,360 A | 11/1992 | Woolf et al. | 505/1 |
| 5,198,043 A | 3/1993 | Johnson | 148/512 |
| 5,200,391 A | 4/1993 | Fisher et al. | |
| 5,204,313 A | 4/1993 | Lelental et al. | 505/1 |
| 5,206,216 A | 4/1993 | Yoshida | 505/1 |
| 5,212,148 A | 5/1993 | Roas et al. | 505/1 |
| 5,225,031 A | 7/1993 | McKee et al. | 156/612 |
| 5,231,074 A | 7/1993 | Cima et al. | 505/1 |
| 5,238,752 A | 8/1993 | Duderstadt et al. | 428/623 |
| 5,240,905 A | 8/1993 | Tanaka et al. | 505/1 |
| 5,248,662 A | 9/1993 | Yoshida et al. | 505/1 |
| 5,256,205 A | 10/1993 | Schmitt, III et al. | 118/723 |
| 5,258,364 A | 11/1993 | Yamazaki | 505/1 |
| 5,270,294 A | 12/1993 | Wu et al. | 505/1 |
| 5,273,959 A | 12/1993 | Lambert et al. | 505/1 |
| 5,284,825 A | 2/1994 | Stephens et al. | |
| 5,290,761 A | 3/1994 | Keating et al. | 505/1 |
| 5,312,804 A | 5/1994 | Petibon et al. | 505/434 |
| 5,330,966 A | 7/1994 | Hayashi et al. | 505/473 |
| 5,340,792 A | 8/1994 | Ovshinsky et al. | 505/123 |
| 5,356,672 A | 10/1994 | Schmitt, III et al. | 427/446 |
| 5,356,673 A | 10/1994 | Schmitt et al. | 427/446 |
| 5,360,784 A | 11/1994 | Kimura et al. | 505/433 |
| 5,372,089 A | 12/1994 | Yoshida et al. | 117/98 |
| 5,378,683 A | 1/1995 | Cabanel et al. | 505/190 |
| 5,379,019 A | 1/1995 | Fiddes et al. | 335/216 |
| 5,426,092 A | 6/1995 | Ovshinsky et al. | 505/461 |
| 5,427,866 A | 6/1995 | Nagaraj et al. | 428/610 |
| 5,432,151 A | 7/1995 | Russo et al. | 505/474 |
| 5,434,130 A | 7/1995 | Hikata et al. | 505/433 |
| 5,439,877 A * | 8/1995 | Face | 505/475 |
| 5,470,668 A | 11/1995 | Wu et al. | 428/688 |
| 5,482,578 A | 1/1996 | Rose et al. | 148/516 |
| 5,516,484 A * | 5/1996 | Kubosono et al. | 148/435 |
| 5,527,765 A | 6/1996 | Hodge et al. | 505/236 |
| 5,545,612 A | 8/1996 | Mizushima et al. | 505/239 |
| 5,571,332 A | 11/1996 | Halpern | 118/723 |
| 5,629,268 A | 5/1997 | Tanaka et al. | 505/329 |
| 5,648,321 A | 7/1997 | Bednorz et al. | 505/473 |
| 5,650,378 A | 7/1997 | Iijima et al. | 505/473 |
| 5,660,746 A | 8/1997 | Witanachchi et al. | 219/121.66 |
| 5,667,663 A | 9/1997 | Rickerby et al. | 205/170 |
| 5,672,569 A | 9/1997 | Nakamura et al. | 505/330 |
| 5,693,140 A | 12/1997 | McKee et al. | 117/108 |
| 5,696,392 A | 12/1997 | Char et al. | 257/190 |
| 5,703,341 A | 12/1997 | Lowndes et al. | 219/121.66 |
| 5,739,086 A | 4/1998 | Goyal et al. | 505/473 |
| 5,872,081 A | 2/1999 | Woolf | |
| 5,964,966 A | 10/1999 | Goyal et al. | |
| 5,968,877 A | 10/1999 | Budai et al. | 505/237 |
| 6,022,832 A | 2/2000 | Fritzemeier et al. | |
| 6,027,564 A | 2/2000 | Fritzemeier et al. | |

OTHER PUBLICATIONS

Goler and Sachs, Zeitschrift fur Physik, vol. 59, pp. 485–494 (1929) (English Translation).

Detert et al., Zeitschrift fur Metallkunde, vol. 54, pp. 263–270 (1963) (German Version).

Detert et al., Zeitschrift fur Metalkunde, vol. 54, pp. 263–270 (1963) (English Translation).

Goler and Sachs, Zeitschrift fur Physik, vol. 59, pp. 477–484 (1929) (German Version).

Goler and Sachs, Zeitschrift fur Physik, vol. 59, pp. 477–484 (1929) (English Translation).

Dillamore and Roberts, Metallurgic Reviews vol. 10, pp. 271–377 (1965).

Goldacker et al., "Biaxially textured substrate tapes of Cu, Ni, alloyed Ni, (Ag) for YBCO films," Applied Superconductivity 1997, vol. 2, pp. 1279–1282, see Abstract.

Brick et al., "Effects of Various Solute Elements on the Hardness and Rolling Textures of Copper," Trans. Am. Soc. for Metals, vol. 31, pp. 675–698 (1943).

Undated Report.

Final Report dated Apr. 22, 1996.

Dionne et al., "Magnetic and Stress Characterization of Nickel Ferrite Ceramic Films Grown by Jet Vapor Deposition,".

Yoshino et al., "Improvement of In–Plane Alignment of Grains in YBCO Films on Ag Tapes," Advances in Superconductivity VI, pp. 759–762.

Budai et al., "In–plane epitaxial alignment of $YBa_2Cu_3O_{7-x}$ films grown on silver crystals and buffer layers," Appl. Phys. Lett. 62 (15), pp. 1836–1838 (Apr. 1993).

Feldman et al., "Epitaxial Growth of A15 $Nb_3Si$," IEEE Transactions on Magnetics, vol. Mag–17, No. 1, pp. 545–548 (Jan. 1981).

Ginsbach et al., "Electrical and Structural Properties of $YBa_2Cu_3O_7$ Films on PO and Single Crystalline Oxides of Cu and Ni," Physica C 185–189 pp. 2111–2112 (1991).

Goyal, "Advances in Processing High–$T_C$ Superconductors for Bulk Applications," JOM p. 11 (Dec. 1994).

Goyal, "Progress Toward Bulk Application of High–$T_C$ Superconductors," JOM p. 55 (Aug. 1995).

Norton et al., "Epitaxial $YBa_2Cu_3O_7$ on Biaxially Textured Nickel (001): An Approach to Superconducting Tapes with High Critical Current Density," Science, vol. 274 p. 755 (Nov. 1996).

Schlom et al., "Origin of the $\phi \approx \pm 9°$ Peaks in $YBa_2Cu_3O_{7-\delta}$ Films Grown on Cubic Zirconia Substrates," H13.49 p. 272.

Budai et al., "In–plane Alignment of YBaCuO Films on Metal Substrates and Buffer Layers," H13.52, p. 272.

Norton et al., "Superconducting Transport Properties and Surface Microstructure for $YBa_2Cu_3O_{7-\delta}$ Based Superlattices . . . ," Submitted to Workshop on Laser Ablation Mechanisms and Applications (May 1991).

Norton et al., "$YBa_2Cu_3O_{7-x}$ Thin Film Growth on Single Crystal and Polycrystalline Yttria–Stabilized Zirconia," Submitted to the Conf. on Science and Technology of Thin–Film Superconductors (Apr. 1990).

Christen et al., "Transport Critical Currents in Epitaxial . . . Thin Films," prepared by the Solid State Division Oak Ridge National Laboratory (Jul. 1989).

Doi et al., "A New Type of Superconducting Wire: Biaxially Oriented $Tl_1$ ($Ba_{0.8}Sr_{0.2}$) . . . , " Advances in Superconductivity VII, pp. 817–820.

Ginsbach, A et al., "Growth of C–Axis Oriented YBaCuO Films on Oxidized Textured Ni Sheets and on (100) and (110) Oriented NiO Single Crystals," IEEE Transactions on Magnetics, vol. 27, No. 2, pp. 1410–1413 (3/91).

Smallman et al., "Advances in the theory of deformation and recrystallization texture formation," Materials Science and Engineering, A184, pp. 97–112 (1994).

\* cited by examiner

| | |
|---|---|
| 100 | |
| 101 | SELECT AND WEIGH THE CONSTITUENT METALS |
| 102 | MELT THE CONSTITUENTS AND COOL |
| 103 | REMELT TO ENHANCE HOMOGENEITY |
| 104 | SHAPE THE SOLIDIFIED MELT AND REDUCE IN SIZE TO FURTHER HOMOGENIZE |
| 105 | MECHANICALLY DEFORM THE SHAPE TO A SMALLER SIZE AND RECRYSTALLIZE TO FORM A SMALL GRAIN SIZE |
| 106 | DEFORMING THE SHAPE IN AN AXIALLY SYMMETRIC MANNER TO A SMALLER SIZE. |
| 107 | PLANAR DEFORM THE ALLOY TO A REDUCTION IN THICKNESS OF BETWEEN 85% TO 99.9% |
| 108 | HEAT TREAT AT A TEMPERATURE EXCEEDING 250°C BUT NOT MORE THAN 95% OF THE MELTING TEMPERATURE |

SUBSTRATES FOR SUPERCONDUCTORS

This invention was made under a Cooperative Research and Development Agreement with Los Alamos National Research Laboratory. The United States Government has certain rights in this invention.

BACKGROUND OF THE INVENTION

The present invention relates to substrates for superconductors, and more particularly to copper-nickel substrates for receiving the deposition of YBCO ($YBa_2Cu_3O_x$, or Yttrium-Barium-Copper-Oxide) high temperature superconducting layers to form so-called YBCO coated conductors. Other closely related superconducting materials which can be used are $REBa_2Cu_3O_x$, in which the Y has been partially or completely replaced by rare earth (RE) elements.

YBCO ($Y$—$Ba_2$—$Cu_3$—$O_x$) is an important superconducting material for the development of superconducting tapes that can be used in superconducting transmission cables, superconducting current leads, superconducting coils for transformers, superconducting magnets for AC and DC motor applications, and superconducting current limiters, as well as other electrical conductors. These applications are based on a basic property of a superconducting material: it has no electrical resistance when cooled below its transition temperature, and can carry a DC electric current without power dissipation.

For the production of YBCO coated conductors, thin substrate tapes (or foils) are typically coated with a thin buffer layer, which in turn is coated with a YBCO layer. A suitable heat treatment is then performed to optimize the superconducting properties of the YBCO layer. One of the functions of the substrate is to impart mechanical strength to the resulting superconducting tape. A second function, which depends on the process type, is to act as a template for a well-textured buffer layer. Compared to the substrate material, this buffer layer provides a much better deposition surface for the YBCO layer in terms of lattice match, texture, coefficient of thermal expansion (CTE) and chemical compatibility. To obtain good superconducting properties, the buffer layer needs to be bi-axially textured—meaning that a lattice plane, preferably its cubic (or tetragonal) lattice face, is oriented such that the cube face is parallel to the tape surface in a substantial majority of its crystallites. In addition, the cube edge in each crystallite should be parallel to the cube edges in all neighboring crystallites.

Some specialized techniques such as Ion Beam Assisted Deposition (IBAD) or Inclined Substrate Deposition (ISD) can deposit a bi-axially textured buffer layer on top of a random polycrystalline or even amorphous substrate. In general, these deposition techniques are very slow or are effective in only a narrow region, and they are not suited for large scale and economical manufacturing of YBCO coated conductors. A more advantageous method is the epitaxial deposition of a bi-axially textured buffer layer (or YBCO superconducting layer) on top of a bi-axially textured metallic substrate. Examples of epitaxial growth by vapor deposition, electroplating, or oxidation, in which native oxide layers grow on parent metals, are numerous and well known, as is the fact that many metals can form bi-axial textures. Few of these textures are useful for deposition of buffer layers and YBCO superconducting layers because of misorientation. However, in many rolled, face-centered cubic (fcc) metals, when properly rolled and heat treated, a well-developed, and very useful, cube texture is obtained. The cube faces are parallel to the rolled surface and a cube edge typically points in the same direction as the rolling direction. Such a texture is called a cube-on-cube texture, with a crystallographic notation of (100) [001]. Another well-known cube texture is the so-called Goss texture (100) [011]. These bi-axial textures are part of a larger family called sheet textures. In the following description of the invention the (100) [001] texture will be referred to as the "cube" texture.

To deposit the buffer layer in an epitaxial manner on the substrate, the substrate material needs to meet certain requirements. The substrate must have a lattice constant and a CTE which are compatible with the buffer layer material and also with the YBCO layer. Ideally, the substrate will yield a bi-axial texture by simple thermo-mechanical means. The substrate is preferably non-magnetic at cryogenic temperatures, that is, at temperatures between room temperature and that of liquid helium, or 4.2 degrees Kelvin. The substrate must be electrically conductive, relatively strong at room temperature, and oxidation resistant at elevated temperatures. There are several metals, such as copper or nickel, that can be bi-axially textured by rolling a selected copper or nickel stock, followed by a so-called secondary recrystallization at an elevated temperature. However, these pure metals have significant drawbacks in that they are either ferromagnetic (Ni) or are easy to oxidize (Cu).

It is known that some binary alloys (a single phase mixture of two metals) can be made into a bi-axially textured tape as well. One example of a cube texture which has been produced in an alloy is iron-nickel, but this alloy has proven to be ferromagnetic, which is detrimental to the performance of the device in many applications. In addition, copper-nickel alloys with small quantities of nickel have previously been textured, but those working in the field believed that the maximum Ni content in the Cu—Ni alloy should not exceed 4.2 percent nickel.

SUMMARY OF THE INVENTION

The present invention features bi-axially textured alloys with a face centered cubic structure, of copper-nickel (Cu—Ni) with 5 to 45 atomic % nickel, preferably 10–40% and more preferably 25–35%, for use as substrate materials for superconducting oxides. Preferred superconducting oxides include the Rare Earth Barium Copper Oxides, (RE)BCO, or Yttrium Barium Copper Oxides, YBCO, but also superconducting oxides from the Thallium, Mercury and Bismuth families. The combination of the substrate and the oxide forms a coated conductor. These Cu—Ni alloys are preferably homogenous, but can have some degree of inhomogeneity with localized concentrations of Ni not exceeding 45%, and can be processed by thermo-mechanical methods to form tapes with a single (100) [001] cube texture. These alloys are non-ferromagnetic and form good substrate materials for subsequent epitaxial buffer layer and superconductor layer deposition, for use in a variety of products.

The enhanced Ni content achieves desirable features in the alloy, such as increased oxidation resistance, decreased CTE, and increased room temperature and high temperature strength. The increased Ni content does not cause ferromagnetism as long as the Ni content does not exceed 42% for applications down to 4.2 degrees Kelvin or 45% for applications at temperatures between 4.2 and 77 degrees Kelvin. With the appropriate buffer layer material, this substrate will not adversely affect the superconducting properties of the superconducting layer.

Cube-textured alloys of the present invention are formed by creating a homogenous solid solution of the alloying elements. The Cu and Ni constituents are weighed, mixed, and melted together to form a CuNi alloy. The starting materials are preferably at least 99% pure. The melt is then cooled to room temperature. The rate of cooling can be slow or fast, with a rapid quench preferred for giving a fine grain size. The solidified alloy is further homogenized by a heat treatment. The alloy is then processed into tape by mechanical means, such as rolling, after which a suitable heat treatment produces the desired cube texture. An optional recrystallization step after the homogenization and partial deformation of the alloy induces a refined grain size of 5 to 70 micrometers, which obtains a cube texture in the rolled and heat treated tapes.

DESCRIPTION OF THE EMBODIMENTS

The present invention provides an alloy with a cube texture which is formed from a single phase mixture of 5 to 45 atomic percent nickel with the balance being copper. A method for making the alloy is also featured.

The cube texture is often indicated by the crystallographic notation (100)[001] and is typically formed by sheet or tape rolling of a suitable metal or alloy, followed by an appropriate heat treatment. Metals or alloys with a face centered cubic (fcc) structure, and which have been processed to display a bi-axial cube texture, have crystallites in which the cube faces are parallel to a tape surface while the cube edges point in the rolling direction.

The cube-textured alloys of the present invention are particularly useful as substrate materials for superconducting composites. The resulting tape-like structure includes a cube-textured substrate, on which, for example, a bi-axially textured buffer layer can be deposited using an epitaxial deposition process. Subsequently, a bi-axially textured superconducting layer can be deposited, again using an epitaxial deposition process.

The quality of the bi-axial cube texture determines the effectiveness of the substrate for use in superconducting composites. The orientation of the cube oriented grains should be within a few degrees of the ideal bi-axial cubic orientation. Grains with an orientation which deviates from the cube texture, should be small in number, preferably well below 15 vol %. The quality of these textures is revealed in their X-ray diffraction pole figures, which show the collective orientations of all crystallites in the irradiated area. Random orientations show no concentration in any direction. Quality textures, on the other hand, show sharp peaks in the pole figures. The sharpness of these peaks is expressed as the Full Width Half Maximum (FWHM) value and is indicative of texture quality. The lower the FWHM value, the sharper the peak, and hence, the better the texture. For polycrystalline materials, a FWHM value of well below 10° is desired. Typically, FWHM values on the order of 4–15° are achieved in the substrates of this invention. Higher FWHM values can be acceptable for substrate purposes, in particular if this reduced texture is off-set by advantages in other areas, such as improved oxidation resistance, or better chemical or CTE compatibility. In general, alloy substrates result in FWHM values that are often slightly higher than the FWHM values of similarly treated pure metal constituents. The alloying does, however, lead to advantages as mentioned above, such as a non-magnetic substrate, improved oxidation resistance, and improved CTE.

When these substrates are used to form superconducting composites, a buffer layer and superconducting layer can be on one side, both sides, partially, or entirely surround the substrate conductor. The buffer layer can be a metal layer or oxide layer, or combinations of both. Each must provide the needed texture, chemical compatibility, matching lattice constant, and proper CTE match. For example, the buffer layer can be a noble metal or noble metal alloy, an oxide with a cubic structure such as, but not limited to, MgO, $CeO_2Yb_2O_3$, or yttria-stabilized zirconia ("YSZ"), or any combination of oxides and/or noble metals. The buffer layer, which can include multiple layers, is preferably deposited in an epitaxial manner, in which the bi-axial texture of the substrate is transferred onto the buffer layer, or first layer of the buffer layer if multiple buffer layers are employed. In this latter instance, each buffer layer transfers its texture to the next layer until the buffer layer is completed. Finally, the top buffer layer transfers its texture onto the YBCO superconducting layer.

Cube-textured alloys of the present invention are formed by creating a homogenous solid solution of the alloying elements. The Cu and Ni constituents are weighed, mixed, and melted together to form a CuNi alloy. The starting materials are preferably at least 99% pure. The melt is then cooled to room temperature. The rate of cooling can be slow or fast, with a rapid quench preferred for giving a fine grain size. The solidified alloy is further homogenized by a heat treatment. The alloy is then processed into tape by mechanical means, such as rolling, after which a suitable heat treatment produces the desired cube texture. An optional recrystallization step after the homogenization and partial deformation of the alloy induces a refined grain size of 5 to 70 micrometers, which obtains a cube texture in the rolled and heat treated tapes.

The binary alloys of the present invention have 5 to 45 atomic percent nickel, preferably 25 to 35%, with the balance being copper. The upper limit of 45 atomic percent nickel is established to minimize the risk of developing ferromagnetic properties, which are detrimental to the performance of the device in many applications of the oxide layer. Further, by remaining below the upper limit, the strong bi-axial cube texture of the alloy is maintained, and the alignment of lattice edges allows the alloy to act as a substrate for superconducting applications.

Figure 1:
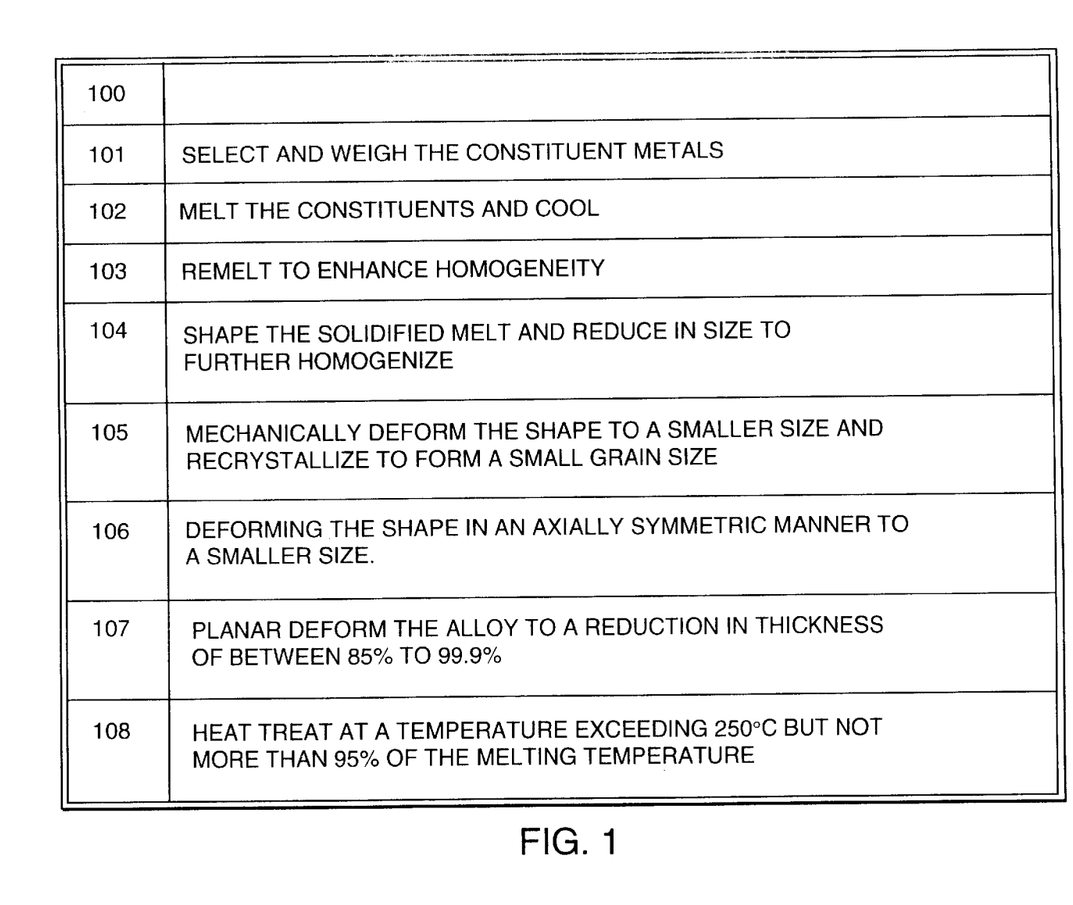
FIG. 1 is a block diagram illustrating the process of forming a cube-textured alloy substrate.

Referring to FIG. 1, a block diagram illustrates the process 100 for forming a cube-textured alloy. The cube-textured binary alloys of the present invention are created by first selecting and weighing the constituent metals (Step 101) in a mixture of 5 to 45 atomic percent nickel, preferably 10–40% and more preferably 25 to 35%, with the balance being copper. This solid solution is then melted (Step 102) by various processes known in the art, such as arc melting, induction melting, plasma torch melting, or melting in an electrical resistance furnace or a furnace heated by gas or coal. Melting temperatures range from 1100° C. to 1250° C. A certain level of homogenization is achieved during the melt process due to convection, mechanical stirring, or stirring induced by the melting techniques such as the induction melter. The melting can be performed in air, under vacuum, or under a protective inert atmosphere such as nitrogen, argon or helium etc. The melting can be repeated several times to further increase homogenization (Step 103). The melt is then cooled with the furnace. The solidified melt is shaped, preferably, into a bar. The bar is reduced in diameter by rod rolling, swaging, drawing or extrusion by a factor of about 1.3 to about 20, preferably about 1.3 to 5, and heat treated to further homogenize the alloy (Step 104). A further mechanical reduction in diameter by similar mechanical means follows, to a size where the planar deformation process will commence (Step 105). Before or at this stage a heat treatment can be applied to recrystallize the alloy and obtain a fine grain size of approximately 5 to 70 micrometers, preferably greater than 10 micrometers and less than 40 micrometers (also Step 105). Alternatively, other methods can be utilized to achieve a fine grain size, such as the rapid solidification of the alloy after melting. An example is the atomization of a melt into an alloy powder, which is subsequently consolidated by (hot) pressing or extrusion into a bar, and which is processed subsequently similar to a cast alloy. The alloy sample is subsequently deformed in an axially symmetric manner, such as extrusion, swaging, drawing, or rod rolling to a smaller size which can be round, square or rectangular (Step 106). In yet another alternate process step, the melt can be cast and rolled. This cast can be further homogenized with a suitable heat treatment, rolled to a thinner size, and recrystallized to induce a fine grain size.

Figure 7:
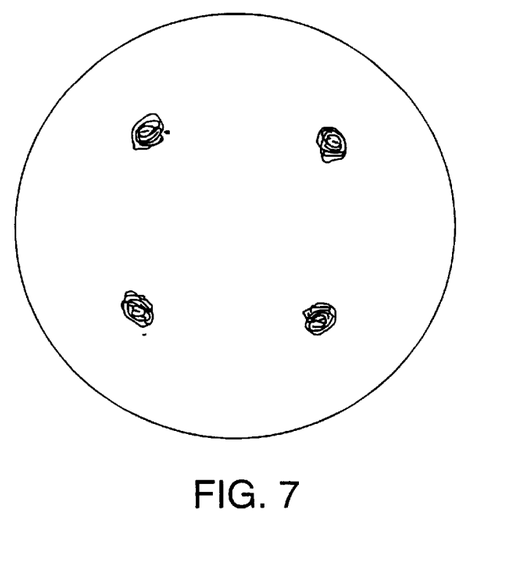
FIGS. 7–10 are pole figures of cube-textured alloys.

The alloy is then deformed further by various planar rolling-methods known in the art (Step 107), to reduce the thickness of the stock by at least 85% and up to 99.9%. The planar deformation is performed at temperatures between −200 and 600° C., and preferably at room temperature. A recrystallization anneal (Step 108) at a temperature exceeding 250° C., but not more than 95% of the melting temperature, and preferably at temperatures between 400 and 1190° C., produces the desired single cube texture (100) [001]. FIG. 7 shows a (111) pole figure, of a Cu—16 at% Ni alloy, which demonstrates a single and high quality (100) [001] cube texture. This alloy is made by extrusion of the homogenized alloy to tape, rolling the tape to a reduction in thickness of 96%, and heat treating the final tape at 850° C. for 4 hours in a protective atmosphere. (See Example 3).

Rolling processes suitable for use with the present invention utilize the following parameters. Rolling is typically performed at room temperature, with rolling between 0.10 m/minute and 100 m/minute. The reduction schedule can be a constant reduction per pass, or a constant strain per pass, with reduction steps chosen to be between 5 and 40% per pass. The tape can be lubricated during rolling, or rolled without any lubricant. Bidirectional rolling is preferred. The tapes can be rolled with large diameter rolls (3.5" to 8" or larger in diameter) or preferably with small diameter rolls (0.75" to 2" in diameter) which can be backed up by larger rolls, in a so-called four-high arrangement. Alternatives to the four-high arrangement are cluster and planetary rolling mills.

Figure 2:
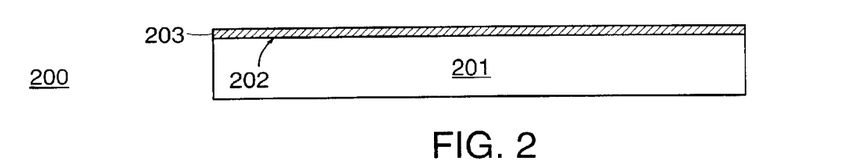
FIG. 2 illustrates a partial cross-sectional view of a superconductor composite formed with a cube-textured alloy substrate.

Referring to FIG. 2, a partial cross section of a superconducting composite 200 is shown. To form a superconducting composite 200, the above described substrates 201 of cube-textured alloys have at least one surface 202 coated with a superconducting oxide 203, such as yttrium-barium-copper-oxide (YBCO) or a rare earth barium copper oxide (REBCO) or mixtures of these. The REBCO's are formed by partial or complete substitution of yttrium (Y) in the YBCO with rare earth elements such as praesodium, neodymium, samarium, europium, gadolinium, terbium, dysprosium, holmium, erbium, thulium, ytterbium, lutetium, lanthenum, or cerium. The coating of the superconducting oxide 203 is preferably approximately 0.2 to 20 micrometers thick, more preferably 1–20 micrometers thick. The coating is applied by any deposition technique, such as a non-vacuum solution deposition, electroplating, chemical vapor deposition, or physical vapor deposition techniques, such as sputtering, laser ablation, thermal evaporation, electron beam evaporation. These deposition techniques can require a heat treatment, such as that disclosed in U.S. Pat. No. 5,231,074 issued to Cima et al., fully incorporated herein by reference, to form the YBCO in an epitaxial manner, and optimize its superconducting properties.

In the Cima patent, highly-textured superconductor oxide thin films are prepared on substrates, including lattice matched, non-lattice matched, inert and non-inert materials, by metal organic deposition (MOD). Precursor solution composition, as well as processing temperature and atmosphere are selected to control the presence of a transient liquid phase. Superconductor oxide films characterized by highly textured morphologies and fully dense, homogeneous microstructures are capable of sustaining critical current densities in excess of $10^4$ A/cm$^2$ at 77 degrees K. when prepared on non-lattice matched substrates or critical current densities in excess of $10^6$ A/cm$^2$ at 77 degrees K. when prepared on lattice-matched substrates.

Figure 3:
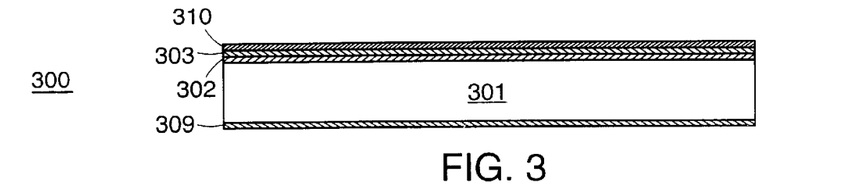
FIG. 3 illustrates a partial cross-sectional view of a superconductor composite formed with a cube-textured alloy substrate and a textured buffer layer.
Figure 3A:
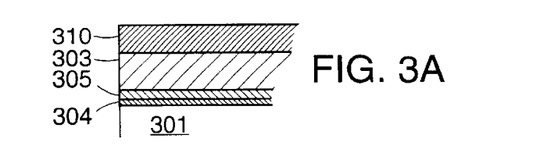
FIGS. 3A and 3B illustrate partial cross-sectional views of superconductor composites formed with multiple buffer layers.

Referring now to FIG. 3, in order to improve the surface characteristics of the substrate 301 of composite 300, for receiving a superconducting oxide coating 303, a buffer layer (or multiple buffer layers) 302 is deposited in an epitaxial process onto the cube-textured alloy substrate 301. Any of the deposition processes listed above, among others, can be used for depositing the buffer layer 302. A heat treatment can be included to form the buffer layer in an epitaxial manner. The buffer layer 302 has a thickness of approximately 0.1 to 10.0 micrometers, and preferably 0.1 to 5.0 micrometers more preferably 0.2 to 0.8 micrometers. It includes a single metal or oxide layer, or can be a multiple layered structure. A structure in which the buffer layer has two layers is shown in FIG. 3A where the substrate 301 is covered with a layer 304 and subsequently a second layer 305, where the combination of layers 304 and 305 form the buffer layer. The multiple layers 304 and 305 can include any combination of layers, such as a metal layer 304 with an oxide layer 305 on top, or an oxide layer 304 with another oxide layer 305 on top. Alternatively, referring to FIG. 3B, the buffer layer can include three or even more layers. In this arrangement, the substrate 301 is coated with a metal or oxide layer 306 which in turn is coated with additional metal or oxide layers 307 and 308 before deposition of the superconducting layer 303.

Figure 3B:
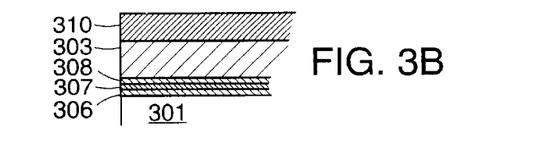

Referring to FIGS. 3, 3A and 3B, a top layer 310 comprising a noble metal (such as silver, gold, palladium, platinum, rhodium, iridium, rhenium or alloys thereof) is optionally deposited on the superconducting layer 303. This layer 310 prevents environmental degradation of the superconducting layer, and provides an alternative current path if the superconducting layer is locally degraded and unable to fully carry the superconducting current. Also, layer 310 provides an additional site to solder the conductor.

The metals for the top and buffer layers are typically noble metals or noble metal alloys. By "noble metal" is meant a metal whose reaction products are thermodynamically stable under the reaction conditions employed relative to the desired superconducting ceramic, and/or a metal which does not react with the superconducting ceramic or its precursors under the conditions of manufacture of the composite. The noble metal can be a metal different from metallic matrix elements of the desired superconducting ceramic. The noble metal can be silver or a silver/gold alloy, but it can also be a stoichiometric excess of one of the metallic elements of the desired superconducting ceramic, such as yttrium. Silver (Ag) and silver alloys are the most preferred noble metals. Other noble metals include platinum, gold, palladium, rhodium, iridium, ruthenium, rhenium or alloys thereof. The oxides that are used for the buffer layers are typically stable oxides with a cubic structure such as MgO, cubic $Al_2O_3$, yttria, YSZ, or rare earth oxides such as $CeO_2$, $Yb_2O_3$ etc. or mixtures of these oxides.

By coating the entire substrate, front, back, and/or the sides, with a buffer layer before the deposition of the superconducting layer, the oxidation resistance of the substrate is improved. FIG. 3 shows a substrate with this optional buffer layer 309 on the bottom side of the substrate.

Figure 4:
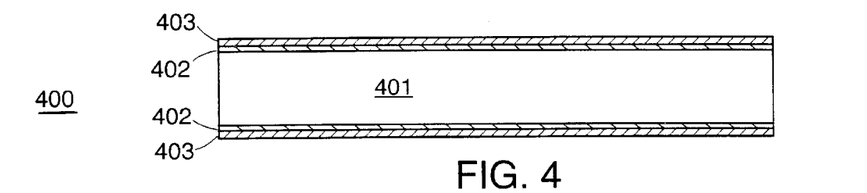
FIG. 4 illustrates a partial cross-sectional view of a superconductor composite having both sides coated with a buffer layer and a superconducting layer.
Figure 5:
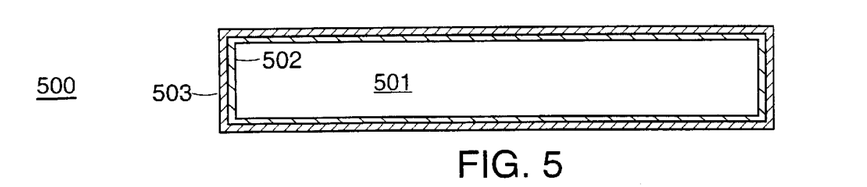
FIG. 5 illustrates a cross-sectional view of a superconductor composite in which the coated layers surround the substrate.

Referring to FIG. 4, there is shown a partial cross-section of a superconducting composite 400. In this embodiment, the composite 400 has a substrate 401 with a pair of surfaces that are each coated with a buffer layer 402. A superconducting oxide 403 is coated on each of the buffer layers 402. In an alternate arrangement, as shown in FIG. 5, the composite 500 has a substrate 501 which is fully surrounded by a buffer layer 502. Furthermore, a superconducting oxide layer 503 fully coats the buffer layers 502 on all surfaces of the composite 500.

Figure 6:
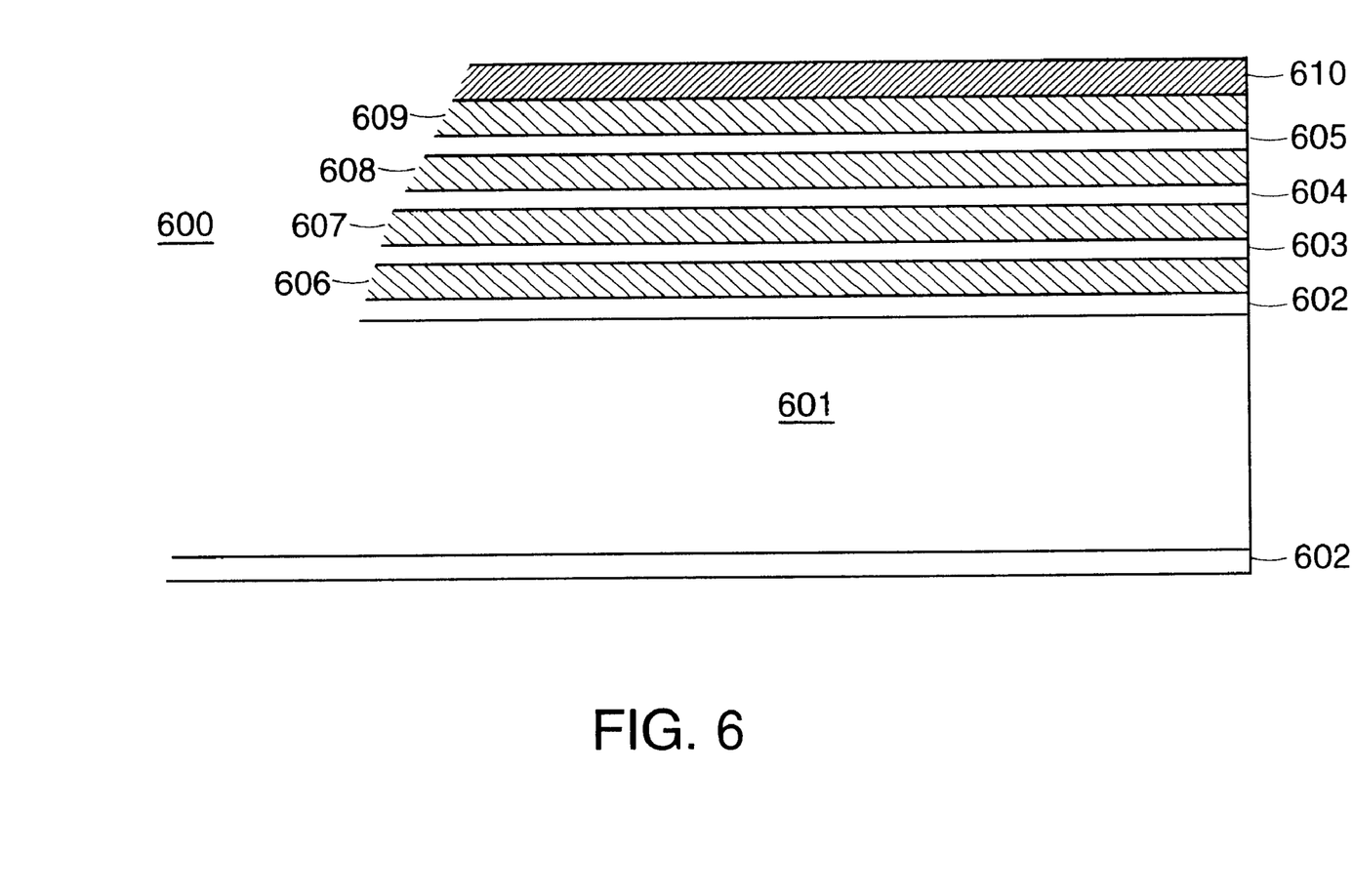
FIG. 6 illustrates a cross-sectional view of a superconductor composite with multiple buffer and superconducting layers.

Referring to FIG. 6, there is shown a partial cross section of a superconducting composite 600. In this embodiment, the composite 600 has a substrate 601 with a pair of surfaces that are each coated with a buffer layer 602. A superconducting oxide 606 is then coated on one side of buffer layer 602. A second buffer layer 603 is coated onto layer 606, after which a second superconducting oxide layer 607 is deposited on this buffer layer 603. In this manner, a multi-layered structure can be built which, for example, has four superconducting layers (606, 607, 608 and 609) interspersed with three substrate layers (603, 604, and 605). This multiple structure increases the current carrying capability of the conductor. In this example, the top superconducting layer 609 is coated with a noble metal layer 610 for environmental protection of the superconductor 609, an alternate current path, and additional sites to solder the conductor.

EXAMPLE 1

Figure 8:
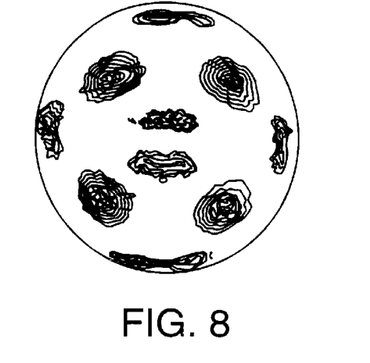

A cube-textured copper-nickel alloy according to the present invention is produced according to the following method. 99.999% pure Ni and Cu pieces (pellets mixed with coarse powders) are weighed in a ratio of 68 at% Cu and 32 at% Ni. The pieces are mixed and loaded in a water cooled copper hearth of an arc melter which operates in a protective atmosphere. The Cu+Ni mixture is melted and solidified several times, to ensure adequate mixing, at a temperature well above the melting temperatures for several minutes. The solidified and cooled alloy is mechanically formed in the shape of a solid cylinder, and is rolled, using 10% deformation per pass, to a total reduction of 99% without any intermediate stress anneal process. The resulting tape is heat treated at 850° C. for 4 hrs using a protective gas of 95% argon and 5% hydrogen. This tape shows mainly a single, bi-axial cube texture, with a minor twinning element which can be seen in the (111) pole figure of FIG. 8.

EXAMPLE 2

A 32 mm diameter oxygen free copper can is loaded with a mixture of Cu and Ni pieces, and the overall exact stoichiometry (including the weight of the copper can) is further adjusted with Cu powder, to a mixture of 16 at% Ni, 84 at% Cu. This can is placed inside a 38 mm diameter thin-walled alumina crucible and heated in a protective atmosphere using a induction melter at about 1170° C., for up to 5 minutes. The use of the induction melter and the fact that the alumina is not an electrical conductor causes stirring in the melt, which promotes homogenization. After solidification, the alloy is removed from the crucible. To enhance homogeneity, the cast is remelted using a similar crucible and the same induction melter, again under vacuum and at the same conditions. The cast alloy, which has a cylindrical shape, is machined to a diameter of 31 mm and extruded to a 17 mm diameter bar. This bar is homogenized at 950° C. for 24 hrs. It is machined to a 16 mm diameter billet, suitable for hydrostatic extrusion. It is extruded to a 3 mm diameter wire and subsequently rolled using a reversible direction rolling technique, with a four-high rolling mill at a rolling speed of 6 m/min, and reduction per pass of 10%. The total reduction in thickness is 98.9%. Subsequently, it is heat treated at 850° C. for 4 hrs under a 95% argon—5% hydrogen gas mixture. This tape has a single bi-axial cube texture and a FWHM value of 6°. A (111) pole figure is shown of this alloy in FIG. 7. The pole figure demonstrates a single, high quality cube texture.

EXAMPLE 3

Figure 9:
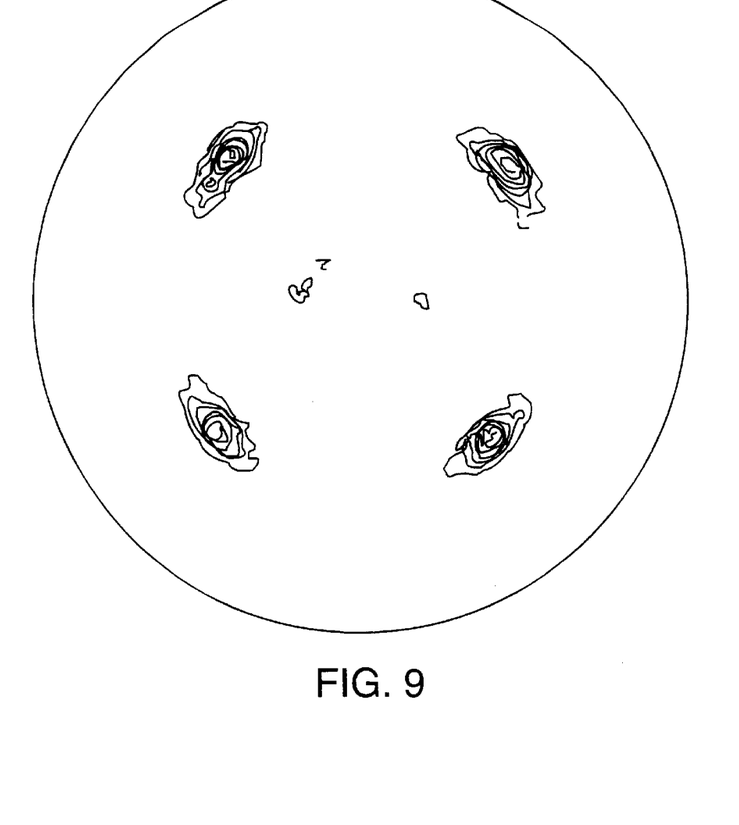

A similar process is followed as in Example 2, but the mixture is 26.5 at% Ni and 73.5 at % Cu. The alloy was extruded to a tape, which was rolled to a reduction in thickness of 96%. The tape was heat treated for 4 hours at 850 degrees Celsius. The final tape made with this alloy has a single bi-axial cube texture, with a FWHM value of 12°. A (111) pole figure of this alloy is shown in FIG. 9.

EXAMPLE 4

Figure 10:
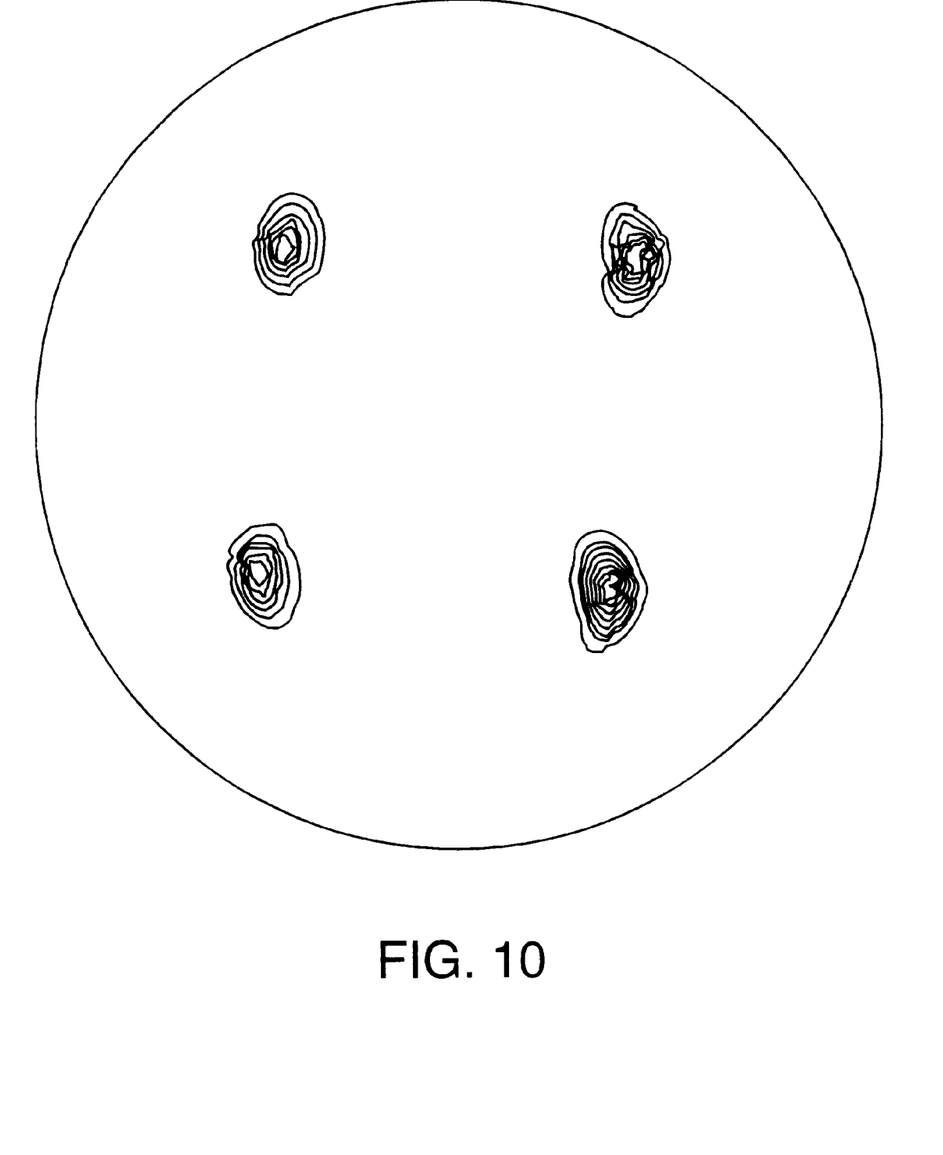

A similar process is followed as in Example 2, but now the mixture is 37 at% Ni and 63 at % Cu. The final foil made with this alloy again has a single bi-axial (100) [001] cube texture, with a FWHM value of 10°. A (111) pole figure of this alloy is shown in FIG. 10.

It will be obvious to those skilled in the art that various changes and modifications can be made therein without departing from the scope of the invention as defined by the appended claims.

What is claimed is:

1. A cube-textured alloy comprising 5 to 45 atomic percent nickel and the balance being copper.

2. A superconducting composite comprising,
   a cube-textured alloy substrate formed from an alloy with 5 to 45 atomic percent nickel and the balance being copper, and a superconducting oxide coating said cube-textured alloy substrate on at least one surface.

3. The superconducting composite of claim 2 wherein the superconducting oxide is a rare earth superconducting copper oxide.

4. The superconducting composite of claim 2 wherein the superconducting oxide is one of the yttrium-barium-copper-oxide superconducting phases.

5. The superconducting composite of claim 2 wherein said superconducting oxide coating has a thickness of approximately 1 micrometer to 20 micrometers.

6. A superconducting composite comprising,
   a cube-textured alloy substrate comprising an alloy of 5 to 45 atomic percent nickel with the balance being copper,
   a buffer layer coated on said substrate, and
   a superconducting oxide coated on said buffer layer.

7. The superconducting composite of claim 6 wherein the superconducting oxide is a rare earth superconducting copper oxide, a yttrium-barium-copper superconducting oxide or mixtures thereof.

8. The superconducting composite of claim 7 wherein the superconducting oxide is one of the yttrium-barium-copper-oxide superconducting phases.

9. The superconducting composite of claim 6 wherein said superconducting oxide coating has a thickness of approximately 1 micrometer to 20 micrometers.

10. The superconducting composite of claim 6 wherein said buffer layer has a thickness of approximately 0.1 micrometer to 10 micrometers.

11. The superconducting composite of claim 6 wherein said buffer layer comprises metals, alloys, oxides, or combinations thereof.

12. A process for forming a cube-textured alloy comprising the steps of:
    creating a mixture of 5 to 45 atomic percent nickel and the balance being copper;
    melting said mixture into a single phase liquid;
    solidifying a copper-nickel alloy from said single phase liquid;
    deforming said alloy;
    planar deforming said alloy; and
    heat treating said alloy to form a bi-axially textured alloy with a cube texture.

13. The process of claim 12 further comprising the step of homogenizing said alloy with a heat treatment after said deforming step and before said planar deforming step.

14. The process of claim 12 wherein said planar deforming step is performed at room temperature.

15. The process of claim 12 wherein said planar deforming step is performed between −200 and +600° C.

16. The process of claim 12 further comprising the step of deforming said alloy in an axially symmetric manner after said deforming step, and before said planar deforming step.

17. A process for forming a superconducting composite comprising the steps of:
    forming a cube-textured alloy substrate from an alloy of 5 to 45 atomic percent nickel and the balance being copper, said substrate having at least one surface;
    coating said at least one surface of said substrate with a superconducting oxide.

18. The process of claim 17 wherein said superconducting oxide is a rare earth superconducting copper oxide, a yttrium-barium-copper superconducting oxide or mixtures thereof.

19. The process of claim 18 wherein said superconducting oxide is one of the yttrium-barium-copper-oxide superconducting phases.

20. The process of claim 17 wherein said superconducting oxide coating has a thickness of approximately 1 micrometer to 20 micrometers.

21. A process for forming a superconducting composite comprising the steps of:
    forming a cube-textured alloy substrate from an alloy of 5 to 45 atomic percent nickel and the balance being copper;
    depositing a buffer layer on said substrate;
    depositing a superconducting oxide on said buffer layer.

22. The process of claim 21 wherein said superconducting oxide is a rare earth superconducting copper oxide, a yttrium-barium-copper superconducting oxide or mixtures thereof.

23. The process of claim 22 wherein said superconducting oxide is one of the yttrium-barium-copper-oxide superconducting phases.

24. The process of claim 21 wherein said superconducting oxide coating has a thickness of approximately 1 micrometer to 20 micrometers.

25. The process of claim 21 wherein said buffer layer has a thickness of approximately 0.1 micrometer to 210 micrometers.

26. The process of claim 21 wherein said buffer layer comprises metals, alloys, oxides, or combinations thereof.

27. An article, comprising:
    a biaxially textured alloy having a full width at half maximum value of from about 4° to about 15° as measured by an X-ray pole figure, wherein the alloy is formed by a process that includes planar deforming the alloy.

28. The article of claim 27, wherein the alloy has cubic texture.

29. The article of claim 27, wherein the alloy comprises nickel.

30. The article of claim 27, wherein the article comprises from about 5 to about 45 atomic percent nickel.

31. The article of claim 27, wherein the alloy is planar deformed by rolling the alloy.

32. The article of claim 27, wherein the process further comprises heat treating the alloy.

33. The article of claim 27, further comprising a buffer layer.

34. The article of claim 33, wherein the buffer layer is deposited on a surface of the alloy.

35. The article of claim 33, further comprising a layer of superconductive material.

36. The article of claim 35, wherein the layer of superconductive material is deposited on a surface of the buffer layer.

37. The article of claim 27, further comprising a layer of superconductive material.

38. The article of claim 27, wherein at most about 15 volume percent of the alloy deviates from a cubic structure.

39. An article, comprising:
    an alloy, at most about 15 volume percent of the alloy deviating from a cubic structure.

40. The article of claim 39, wherein the alloy comprises nickel.

41. The article of claim 39, wherein article comprises from about 5 to about 45 atomic percent nickel.

42. The article of claim 39, wherein the article is formed by a process comprising planar deforming the alloy.

43. The article of claim 42, wherein the process further comprises heat treating the alloy.

44. The article of claim 39, further comprising a buffer layer.

45. The article of claim 44, wherein the buffer layer is deposited on a surface of the alloy.

46. The article of claim 44, further comprising a layer of superconductive material.

47. The article of claim 46, wherein the layer of superconductive material is deposited on a surface of the buffer layer.

48. The article of claim 39, further comprising a layer of superconductive material.

49. The cube textured alloy of claim 1, wherein the cube-textured alloy consists of copper and nickel.

50. The superconducting composite of claim 2, wherein the cube-textured alloy consists of copper and nickel.

51. The superconducting composite of claim 6, wherein the cube-textured alloy consists of copper and nickel.

52. The process of claim 12, wherein the cube-textured alloy consists of copper and nickel.

53. The process of claim 17, wherein the cube-textured alloy consists of copper and nickel.

54. The process of claim 21, wherein the cube-textured alloy consists of copper and nickel.

55. The article of claim 27, wherein the biaxially textured alloy consists of copper and nickel.

56. The article of claim 39, wherein the biaxially textured alloy consists of copper and nickel.

57. The cube-textured alloy of claim 1, wherein the alloy comprises from 10 atomic percent to 40 atomic percent nickel and the balance copper.

58. The cube-textured alloy of claim 1, wherein the alloy comprises from 25 atomic percent to 35 atomic percent nickel and the balance copper.

59. The superconducting composite of claim 2, wherein the alloy comprises from 10 atomic percent to 40 atomic percent nickel and the balance copper.

60. The superconducting composite of claim 2, wherein the alloy comprises from 25 atomic percent to 35 atomic percent nickel and the balance copper.

61. The superconducting composite of claim 6, wherein the alloy comprises from 10 atomic percent to 40 atomic percent nickel and the balance copper.

62. The superconducting composite of claim 6, wherein the alloy comprises from 25 atomic percent to 35 atomic percent nickel and the balance copper.

63. The process of claim 17, further comprising:
melting a mixture comprising 5 atomic percent to 45 atomic percent nickel and the balance copper to form a liquid;
solidifying the liquid to form an alloy comprising 5 atomic percent to 45 atomic percent nickel and the balance copper;
rolling and annealing the alloy to form the cube textured alloy comprising 5 atomic percent to 45 atomic percent nickel and the balance copper.

64. The process of claim 17, wherein the cube-textured alloy comprises from 10 atomic percent to 40 atomic percent nickel and the balance copper.

65. A process, comprising:
deforming an alloy comprising from 5 atomic percent to 45 atomic percent nickel and the balance copper to form a cube textured alloy.

66. The process of claim 65, wherein the alloy comprises from 10 atomic percent to 40 atomic percent nickel and the balance copper.

67. The process of claim 65, wherein the alloy comprises from 25 atomic percent to 35 atomic percent nickel and the balance copper.

68. The process of claim 65, wherein deforming the alloy includes planar deforming the alloy.

69. The process of claim 68, wherein planar deforming the alloy includes reducing the thickness of the alloy by at least about 85%.

70. The process of claim 68, wherein planar deforming the alloy includes reducing the thickness of the alloy by from about 85% to about 99.9%.

71. The process of claim 68, wherein planar deforming occurs at a temperature of from about −200° C. to about 600° C.

72. The process of claim 68, wherein planar deforming occurs at about room temperature.

73. The process of claim 65, wherein deforming the alloy comprises mechanically deforming the alloy.

74. The process of claim 65, wherein deforming the alloy includes deforming the alloy in an axially symmetric manner.

75. The process of claim 65, wherein deforming the alloy comprises a process selected from the group consisting of rolling the alloy, swaging the alloy, drawing the alloy and extruding the alloy.

76. The process of claim 65, further comprising annealing the alloy after deforming the alloy.

77. The process of claim 76, wherein annealing the alloy occurs at a temperature of at least about 250° C.

78. The process of claim 76, wherein annealing the alloy occurs at a temperature of from about 400° C. to about 1190° C.

79. The process of claim 76, wherein annealing the alloy occurs at a temperature that is less than about 95% of the melting temperature of the alloy.

80. The process of claim 76, wherein annealing occurs in a vacuum.

81. The process of claim 76, wherein annealing occurs in a gas environment comprising about 95% argon and about 5% hydrogen.

* * * * *